(12) United States Patent
Butenhoff et al.

(10) Patent No.: US 7,271,674 B1
(45) Date of Patent: Sep. 18, 2007

(54) AUTOMATIC LEVEL CONTROL FOR RADIO FREQUENCY AMPLIFIERS

(75) Inventors: Michael E. Butenhoff, Savage, MN (US); Yongwang Ding, Austin, TX (US)

(73) Assignee: DSP Group Inc., Santa Clara, CA (US)

( * ) Notice: Subject to any disclaimer, the term of this patent is extended or adjusted under 35 U.S.C. 154(b) by 1 day.

(21) Appl. No.: 10/918,744

(22) Filed: Aug. 13, 2004

Related U.S. Application Data

(60) Provisional application No. 60/495,745, filed on Aug. 15, 2003.

(51) Int. Cl.
*H03L 5/00* (2006.01)
(52) U.S. Cl. .......................................... 331/183; 331/74
(58) Field of Classification Search ................. 331/183, 331/74; 330/254
See application file for complete search history.

(56) References Cited

U.S. PATENT DOCUMENTS 5,196,808 A * 3/1993 Pickett et al. ................ 330/298
6,052,036 A * 4/2000 Enstrom et al. ............. 331/176
6,396,354 B1 * 5/2002 Murayama et al. ........... 331/17
6,680,655 B2 * 1/2004 Rogers ........................ 331/109
6,741,137 B1 * 5/2004 Sibrai et al. ................. 331/109
6,744,320 B2 * 6/2004 Nguyen et al. .............. 330/254
6,825,722 B2 * 11/2004 Segawa ....................... 330/254

\* cited by examiner

*Primary Examiner*—Joseph Chang
(74) *Attorney, Agent, or Firm*—Shumaker & Sieffert, P.A.

(57) ABSTRACT

The disclosure relates to an automatic level control technique for RF amplifiers in a communication system, such as a wireless communication system. The invention provides an automatic level control technique to compensate for variations in the gain of an RF amplifier, which may be a transmitter amplifier or a receiver amplifier. In accordance with the invention, the gain of the RF amplifier can be controlled as a function of the output of a voltage controlled oscillator (VCO) circuit provided in the communication system. A VCO typically includes a buffer amplifier with a structure similar to that of the RF amplifier used in the transmit or receive side of the RF front-end. By tracking changes in the output of the VCO buffer amplifier, an automatic level control (ALC) input to the RF amplifier can be adjusted to compensate for process- and temperature-based variations in amplifier gain.

10 Claims, 10 Drawing Sheets

AUTOMATIC LEVEL CONTROL FOR RADIO FREQUENCY AMPLIFIERS

This application claims the benefit of U.S. Provisional Application Ser. No. 60/495,745, filed Aug. 15, 2003, the entire content of which is incorporated herein by reference.

TECHNICAL FIELD

The invention relates to communication devices and, more particularly, to techniques for controlling the gain of a radio frequency (RF) amplifier.

BACKGROUND

Radio frequency (RF) amplifiers are used in a variety of communication systems. A wireless communication system, for example, may require an RF front-end running at frequencies in the Gigahertz (GHz) range. In order to minimize power consumption and filter out unwanted signals and noise at those frequencies, RF amplifiers with inductor-capacitor (LC) tanks are typically used.

In most cases, the gain of an inductor-based RF amplifier is a function of the transconductance of an input transistor and an impedance of an output inductor-capacitor (LC) tank within the amplifier. Usually, the impedance of the LC tank is designed to be much smaller than the transistor output impedance. Consequently, the LC tank tends to dominate the output impedance. At a resonance frequency, the output impedance is inversely proportional to the series resistance associated with the inductor.

Unfortunately, the gain of an RF amplifier can vary significantly as a function of process, temperature, and age variations. In a typical CMOS process, for example, the transconductance and inductor series resistance can vary significantly with process and temperature variations. As a result, the performance of the RF amplifier can vary, resulting in degradation of the performance of the overall communication system.

SUMMARY

In general, the invention relates to an automatic level control technique for RF amplifiers in a communication system, such as a wireless communication system. The invention provides an automatic level control technique to compensate for variations in the gain of an RF amplifier, which may be a transmitter amplifier or a receiver amplifier, in the wireless communication system.

In accordance with the invention, the gain of the RF amplifier can be controlled as a function of the output of a voltage controlled oscillator (VCO) circuit within a phase locked loop (PLL) provided in the communication system. A VCO typically includes a buffer amplifier with a structure similar to that of the RF amplifier used in the transmit or receive side of the RF front-end. For example, the buffer amplifier may include an inductor-capacitor (LC) tank and transistors similar to those used in the RF amplifier.

The invention takes advantage of the structural similarity between the VCO buffer amplifier and the RF amplifier to provide automatic level control for the RF amplifier. By tracking changes in the output of the VCO buffer amplifier, an automatic level control (ALC) input to the RF amplifier can be adjusted to compensate for process- and temperature-based variations in amplifier gain. In particular, the VCO provides a constant input to the buffer amplifier. Consequently, any amplitude variation in the output of the buffer amplifier, given the constant VCO input, provides a direct indication of gain variation in the buffer amplifier.

Hence, due to the similarity between the buffer amplifier in the VCO circuit and the RF amplifier, the gain variation indicated by the buffer amplifier serves as an indication of the gain variation in the RF amplifier. By adjusting the ALC input to the RF amplifier based on the output of the buffer amplifier in the VCO circuit, a more stable gain can be achieved in the RF amplifier.

In one embodiment, the invention is directed to a device comprising a voltage controlled oscillator (VCO) circuit, and a radio frequency (RF) amplifier with a gain controlled as a function of an output of the VCO circuit.

In another embodiment, the invention is directed to a method comprising tracking a variation in an output of a voltage controlled oscillator (VCO) circuit, and controlling a gain of a radio frequency (RF) amplifier based on the variation. In some embodiments, the output may be proportionate to a control bias of a buffer amplifier in the VCO circuit.

In a further embodiment, the invention is directed to a device comprising a means for generating a signal with a substantially constant amplitude, a first RF amplifier that amplifies the signal, a means for generating an adjustment level control (ALC) signal based on the amplified signal, and a second RF amplifier that controls an associated gain based on the ALC signal.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
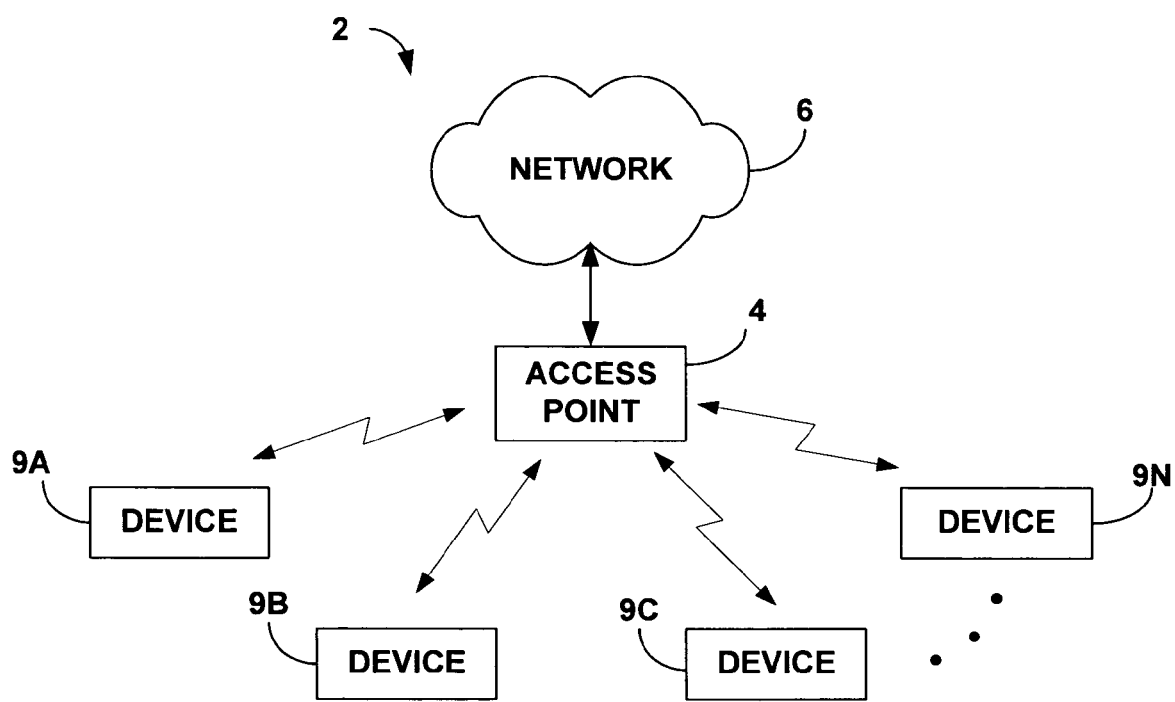
FIG. 1 is a block diagram illustrating a wireless communication network.

FIG. 1 is a block diagram illustrating a wireless communication network 2. Although the automatic level control (ALC) techniques described herein may be applicable to peripheral devices useful with a wide array of computing devices, the techniques will be described in the context of a wireless communication network 2 for purposes of illustration.

As shown in FIG. 1, wireless communication network 2 may include at least one wireless access point 4 coupled to a wired network 6. Wireless access point 4 permits wireless communication between wired network 6 and one or more wireless computing devices 9A-9N (collectively "wireless computing devices 9").

Wireless access point 4 and wireless computing devices 9 may communicate according to one or more Wireless Local Area Network (WLAN) protocols such as those specified by the IEEE 802.11a, 802.11b, 802.11e or 802.11g standards. Wireless communication network 2 will be generally described herein in the context of the IEEE 802.11 standards for purposes of illustration.

Wireless access point 4 may integrate a hub, switch or router to serve multiple devices 9. Wireless communication network 2 may be used to communicate data, voice, video and the like between devices 9 and wired network 6 according to a variety of different wireless transmission formats, such as Orthogonal Frequency Division Multiplexing (OFDM). Network 6 may be a local area network (LAN), wide area network (WAN) or global network such as the Internet.

Wireless computing devices 9 may take a variety of forms including desktop computers, portable computers, personal digital assistants (PDAs), wireless telephones, multimedia devices, consumer electronics and the like. Each device 9 is equipped with hardware to provide attachment to wireless communication network 2. For example, a wireless communication device 9 may include a peripheral device, such as a wireless network card or board coupled to a host computer via an external or internal interface, including Peripheral Component Interconnect (PCI), Mini PCI, Universal Serial Bus (USB), USB-2, Cardbus, IEEE 1394, or Personal Computer Memory Card International Association (PCMCIA) interfaces.

In general, one or more of wireless computing devices 9 implement techniques for automatic level control in accordance with the invention. In particular, the output of a voltage controlled oscillator (VCO) circuit within one of wireless computing device 9 is used to control an automatic level control (ALC) signal applied to an RF amplifier in the transmit or receive chain of the computing device. The ALC signal adjusts a gain of the RF amplifier to compensate for performance variations due to process, temperature and age variations in the amplifier. Thus, the automatic level control techniques allow wireless computing devices 9 to compensate for variations in the gain of an RF amplifier, which may be a transmitter amplifier or a receiver amplifier, in the wireless communication system.

Figure 2:
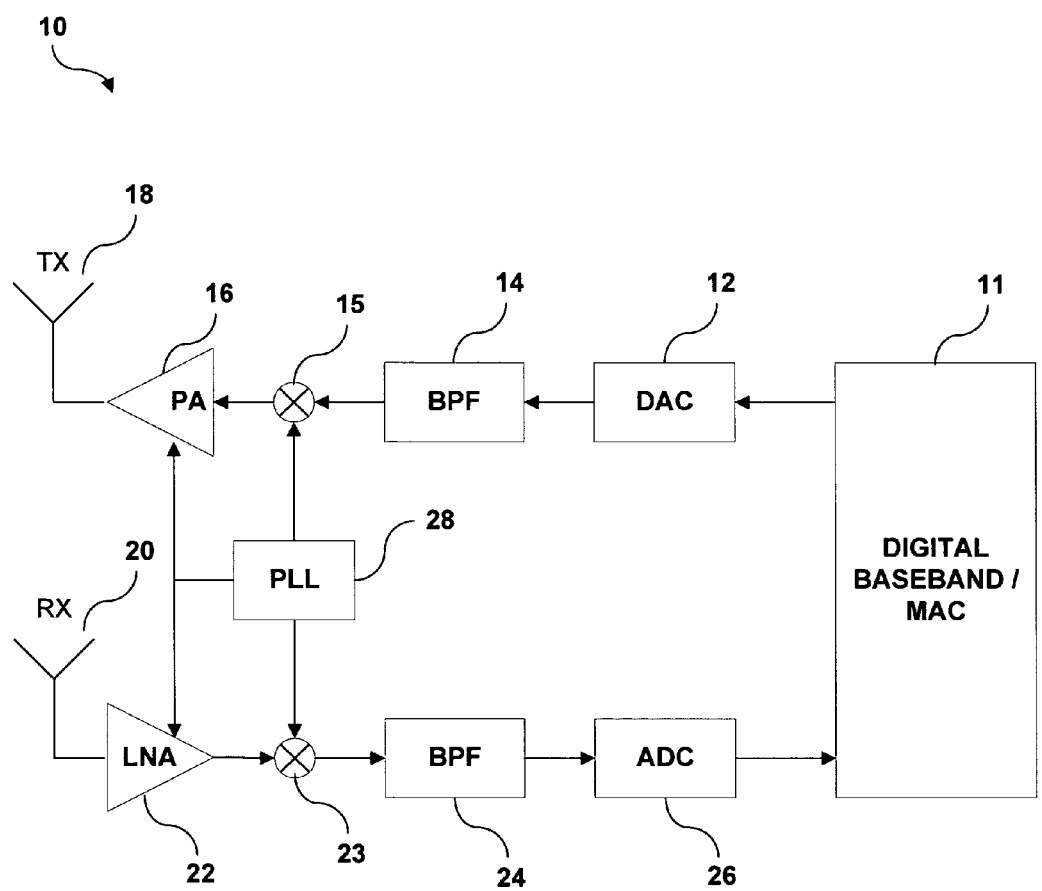
FIG. 2 is a block diagram illustrating a wireless communication device.

FIG. 2 is a block diagram illustrating a wireless communication device 10 in further detail. Wireless communication device 10 may, for example, represent any of wireless communication devices 9 of FIG. 1. As shown in FIG. 2, device 10 includes a digital baseband/medium access control (MAC) unit 11, a digital to analog converter (DAC) 12, a bandpass filter (BPF) 14, a mixer 15, a transmitter amplifier (PA) 16, a transmit (TX) antenna 18, a receive (RX) antenna 20, a receiver amplifier (LNA) 22, a mixer 23, a bandpass filter (BPF) 24, an analog-to-digital converter (ADC) 26, and a phase-locked loop (PLL) 28. Device 10 is equipped to both transmit and receive signals, coordinated by digital baseband/MAC unit 11, which utilizes protocols, such as the protocol specified by the IEEE 802.11 standards described above, to support communication over a wireless medium.

A digital baseband signal is generated by a host device (not shown), such as a computing device, a personal digital assistant (PDA), a mobile telephone, or the like, utilizing wireless communication device 10. Digital baseband/MAC unit 11 interacts with the host device to coordinate access to an RF channel for the signal. DAC 12 converts the digital baseband signal to an analog baseband signal. The analog baseband signal may then be upconverted and modulated to enable signal propagation at the channel frequency.

As an example, the signal may have a baseband frequency of 10 MHz with a bandwidth of 20 MHz. A wireless communication system operating according to an IEEE 802.11a standard requires an orthogonal frequency division multiplexing (OFDM) modulation technique to transmit signals at a 5 GHz band. BPF 14 prepares the signal for transmission by filtering the signal at the given bandwidth. Mixer 15 combines the filtered signal from BPF 14 with an output of PLL 28, and upconverts the signal to radio frequency. The RF signal is amplified by PA 16 and transmitted by TX antenna 18.

PLL 28 also feeds into PA 16 and includes a voltage controlled oscillator (VCO) circuit (not shown in FIG. 2) that can be used to reduce gain variation in the PA over process, temperature, and age ranges, in accordance with the invention. In particular, the gain of an inductor-based RF amplifier, such as a CMOS amplifier, varies with process, temperature and age as a function of a transconductance of an input transistor and an impedance of an output LC tank. For example, the voltage gain ($A_v$) of an RF amplifier, such as PA 16 or LNA 22, is given as $$A_v = g_{m1} \cdot Z_{out},$$

where $g_{m1}$ is the transconductance of the input transistor and $Z_{out}$ is the output impedance. Usually, the output impedance of the LC tank is designed to be much smaller than the transistor output impedance, so that the LC tank dominates the output impedance. At a resonant frequency, ($\omega_O^2 LC = 1$, where $\omega_O = 2\pi f_O$) the output impedance is $$Z_{out} = \frac{(\omega_o L)^2}{R_L},$$

where $R_L$ is a series resistance associated with the inductor L, L is the inductance value of the inductor, and $\omega_o$ is the resonant frequency. Therefore, at the resonant frequency the voltage gain of an RF amplifier is given by $$A_v = g_{m1} \cdot \frac{(\omega_o L)^2}{R_L}.$$

In a typical CMOS process, both $g_{m1}$ and $R_L$ vary in a large range over process corners and temperature. In some extreme cases, the total voltage gain can vary by as large as eight times, which is about 18 dB. Large gain variation can create serious problems. For example, gain variation may require a larger dynamic range within wireless communication circuits, and also reduce a yield of a chip on which the communication circuits are formed.

In accordance with the invention, the output of the VCO circuit within PLL 28 is used to control an automatic level control (ALC) signal applied to PA 16. The ALC signal controls a gain of PA 16 to compensate for performance and structural variations in the amplifier. PA 16 may, for example, control the gain by using the ALC signal to change a tail current of PA 16, change a transconductance of input transistors in PA 16, change an output impedance of PA 16, or change other parameters resulting in an adjustment in gain value.

The receiver portion of wireless communication device 10 works much the same as the transmitter portion, only in reverse. A transmitted signal is received by RX antenna 20 and amplified by LNA 22. Again, PLL 28 feeds into LNA 22 to stabilize any gain variation. BPF 24 uses the same bandwidth as BPF 14 in the transmit sequence and separates the desired signal from other signals in the frequency band. PLL 28 output is combined with BPF 24 output in mixer 23 to determine the phase of the received signal. The recovered signal is demodulated to the baseband frequency by, for example, an OFDM demodulation technique. ADC 26 converts the baseband analog signal into a baseband digital signal to enable interaction with the host device via digital baseband/MAC unit 11.

Figure 3:
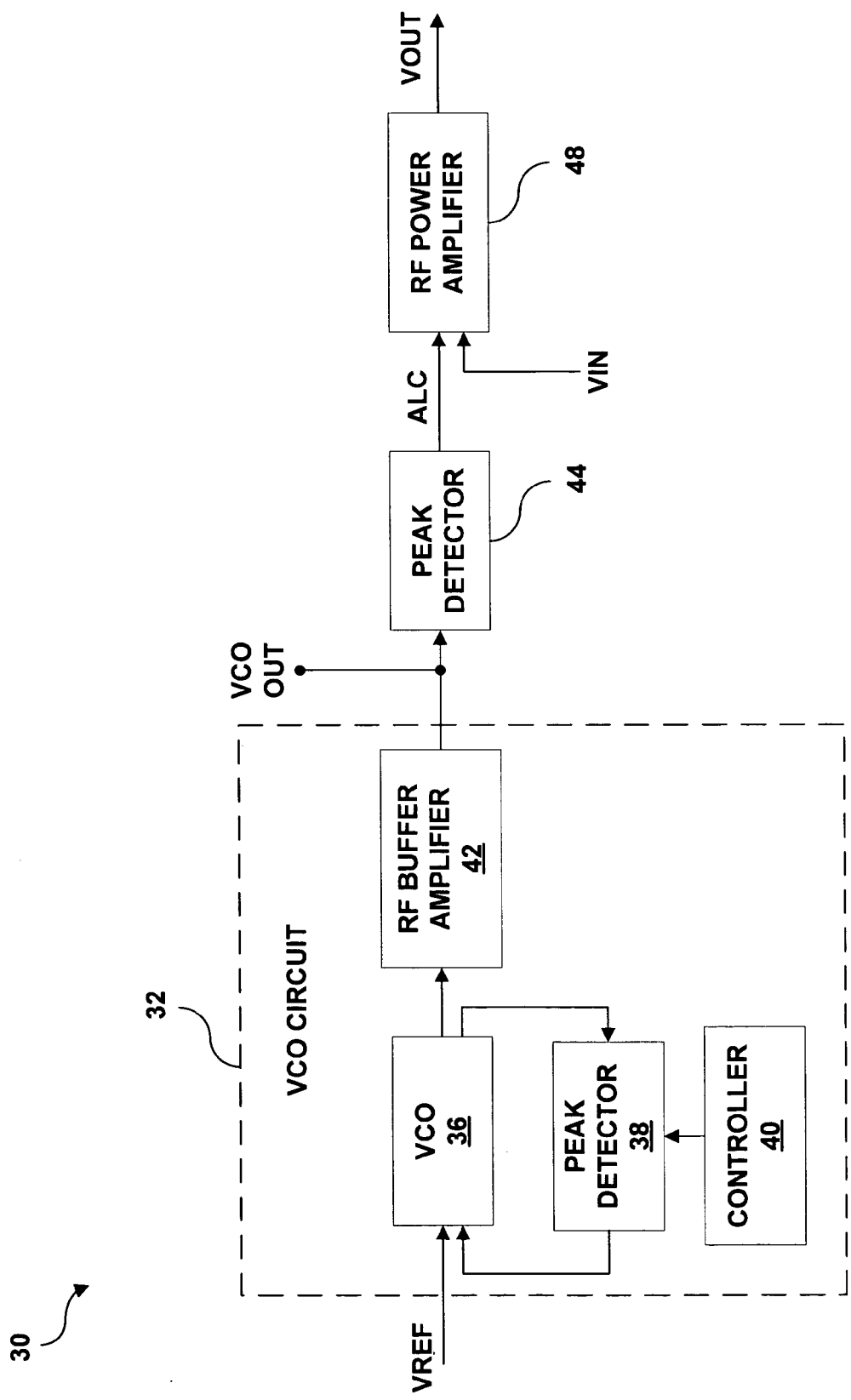
FIG. 3 is a block diagram illustrating an RF amplifier circuit.

FIG. 3 is a block diagram illustrating an RF amplifier circuit 30 that provides automatic level control in accordance with the invention. RF amplifier circuit 30 includes a voltage controlled oscillator (VCO) circuit 32, a peak amplitude detector 44, and a first RF amplifier 48. VCO circuit 32 includes a voltage controlled oscillator (VCO) 36, a peak amplitude detector 38, a controller 40, and a second RF amplifier, i.e., RF buffer amplifier 42. VCO circuit 32 generates a VCO circuit output signal (VCO OUT) at the output of RF buffer amplifier 42. Peak amplitude detector 44 receives the VCO OUT signal and generates an automatic level control (ALC) input signal for RF amplifier 48. The ALC signal allows RF amplifier 48 to predictably control signal gain as a function of process and temperature variations.

In particular, due to structural similarities between RF amplifier 48 and RF buffer amplifier 42 in VCO circuit 32, the gain of RF amplifier 48 can be controlled as a function of the output of RF buffer amplifier 42. VCO 36 provides a substantially constant input to RF buffer amplifier 42. Consequently, any amplitude variation in the output of the buffer amplifier 42, given the substantially constant input from VCO 36, provides a direct indication of gain variation in the buffer amplifier 42.

Hence, due to the similarity between the buffer amplifier 42 in the VCO circuit 32 and the RF amplifier 48, the gain variation indicated by the buffer amplifier 42 serves as an approximate indication of the gain variation in the RF amplifier itself. By adjusting the ALC input to the RF amplifier 48 based on the output of the buffer amplifier 42 in the VCO circuit 48, a more stable gain can be achieved in the RF amplifier 48.

Circuit 30 may be applied in a wireless communication device, such as wireless communication device 10 of FIG. 2. For example, RF amplifier 48 may be either a transmitter amplifier (PA) 16 or a receiver amplifier (LNA) 22 (FIG. 2). In addition, VCO circuit 32 may be included within PLL 28 (FIG. 2). Modern wireless communication devices may use inductor-based RF amplifiers 42, 48 with components formed on a Metal layer of a wireless communication circuit. High frequency operations, e.g., in the GHz range, can cause wide variations in the performance of the Metal layer, and therefore, in the performance of inductor-based RF amplifiers 42, 48. The variations can be compensated by using a substantially constant VCO input signal for RF buffer amplifier 42 and generating the ALC input signal for RF amplifier 48 as a function of the output of RF buffer amplifier 42.

As shown in FIG. 3, VCO 36 receives a reference voltage (VREF), such as a voltage provided by a stable source, such as a crystal oscillator or other external source. Peak amplitude detector 38 detects the peak amplitude of an output of VCO 36. The peak amplitude output is fed back into VCO 36 and compared to VREF by a comparator (not shown) included in VCO 36. The comparison allows the amplitude of the output signal of VCO 36 to be controlled to maintain a substantially constant level. The constant amplitude output signal from VCO 36 is input to RF buffer amplifier 42 and amplified. Due to the constant amplitude input, the amplitude of the output of RF buffer amplifier 42 (VCO OUT) indicates the gain of the RF buffer amplifier, which in turn provides an indication of the gain of RF amplifier 48. The amplified output signal of RF buffer amplifier 42 is the output (VCO OUT) of VCO circuit 32.

In some embodiments, the peak amplitude detection of peak amplitude detector 38 and the comparison performed in VCO 36 may only be performed for a change in a frequency channel of a received or transmitted signal amplified by RF amplifier 48, rather than on a continuous basis. During the frequency channel change, controller 40 activates peak amplitude detector 38 to allow the signal comparison to occur. Once the change in the frequency channel is complete, controller 40 deactivates peak amplitude detector 38 and disables the comparison feedback loop. Thus, the constant VCO 36 output signal is only subject to variation during the change in a frequency channel. Deactivating peak amplitude detector 38 following the change in the frequency channel reduces power usage in the VCO circuit 32 and eliminates any phase disruption that might occur due to a continually running comparison feedback loop.

Peak amplitude detector 44 detects a peak amplitude of the output signal (VCO OUT) of VCO circuit 32. Peak amplitude detector 44 generates the ALC signal based on the peak amplitude of the VCO circuit output signal, VCO OUT. The ALC signal may be, for example, a 4-bit digital word. In that case, the peak amplitude detector 44 includes an analog-to-digital converter in order to create the digital ALC signal from the analog VCO circuit output signal VCO OUT. Again, VCO OUT is ostensibly the output of VCO circuit 32, and specifically the output of RF buffer amplifier 42.

RF amplifier 48 receives an input signal voltage (VIN) along with the ALC signal generated by peak amplitude detector 44. In embodiments in which the ALC signal is a digital control word, RF amplifier 48 includes a digital controller to adjust the gain of the RF amplifier 48 in response to the digital ALC control word. For example, RF amplifier 48 may include a digital controller in the form of digital control switches (not shown) that respond to the digital ALC signal to adjust various parameters within RF amplifier 48. For example, the gain of RF amplifier 48 can be controlled by using the ALC signal to change a tail current of RF amplifier 48, change a transconductance of input transistors in RF amplifier 48, or change an output impedance of RF amplifier 48. There are also other ways to control the gain with the ALC bits, such as controlling digital switches to redirect portions of the output current from RF amplifier 48 or change the source degenerating resistors, e.g., via a resistor network.

RF amplifier 48 has a substantially constant gain due to the gain control by the ALC signal in RF amplifier 48. The constant gain compensates for process and temperature variations that occur in GHz range communication circuits without signal control circuitry.

Figure 4:
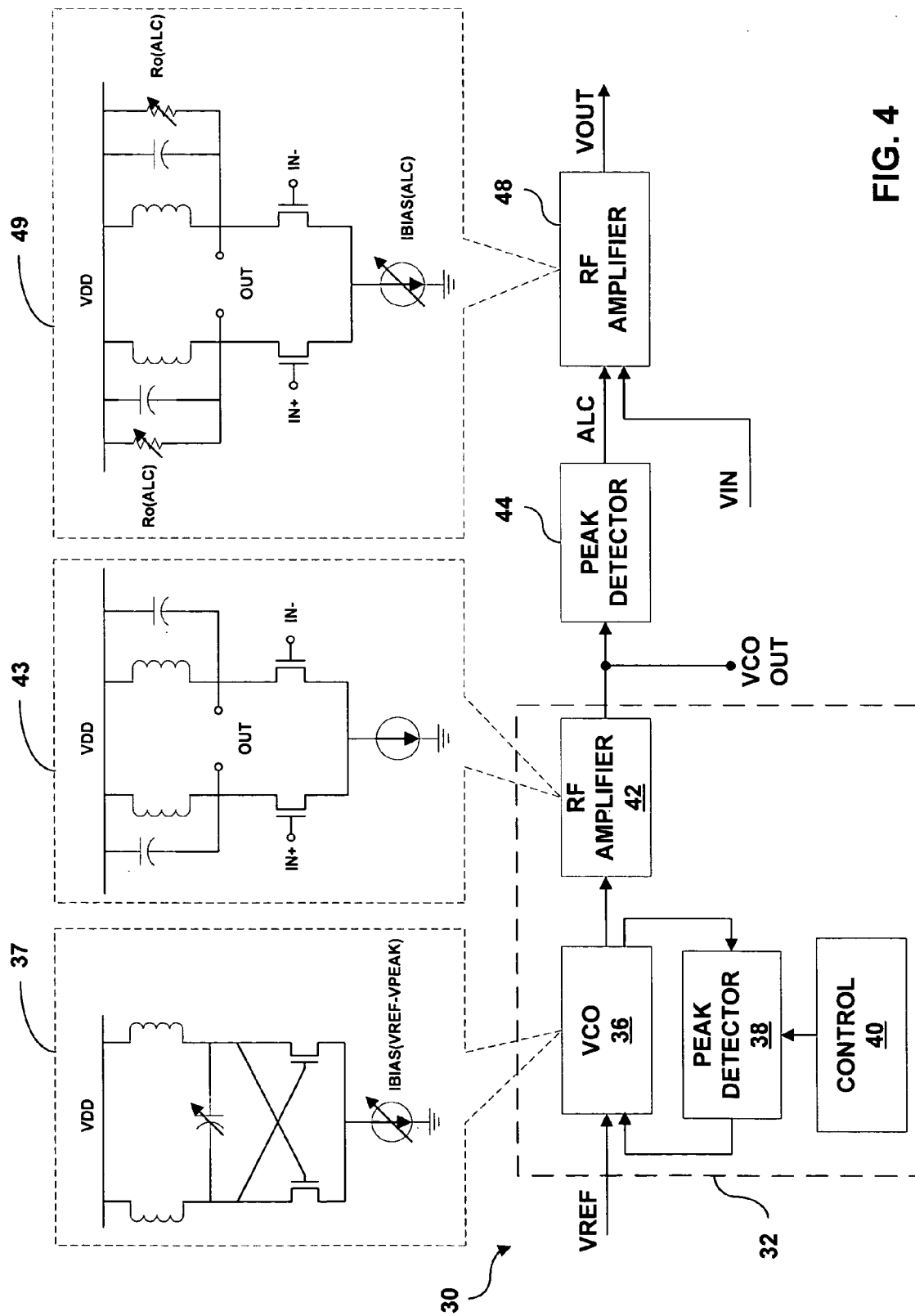
FIG. 4 is a block diagram illustrating an embodiment of an RF amplifier circuit in further detail.

FIG. 4 is a block diagram illustrating an embodiment of an RF amplifier circuit 30 in further detail. Circuit 30 operates as described in reference to FIG. 3 and again includes a voltage controlled oscillator (VCO) circuit 32, a peak amplitude detector 44, and an RF amplifier 48. VCO circuit 32 includes a voltage controlled oscillator (VCO) 36, a peak amplitude detector 38, a control 40, and an RF buffer amplifier 42. VCO circuit 32 generates a VCO circuit output signal (VCO OUT). As shown in FIG. 4, voltage controlled oscillator (VCO) 36, RF buffer amplifier 42, and RF amplifier 48 comprise similar circuits including inductive loads. The illustrated circuits describe one way to build RF amplifier circuit 30; many other circuit designs, however, could be used to realize a similar function.

VCO 36 comprises an oscillator circuit 37 including inductive loads, a variable capacitor, and a variable current source. The current source, IBIAS (VREF−VPEAK), depends on the difference between a reference signal voltage (VREF) and a peak voltage (VPEAK) detected by peak amplitude detector 38. The variable current source allows an output of VCO 36 to be controlled to a substantially constant level. RF buffer amplifier 42 comprises an amplifier circuit 43 including inductive-capacitive (LC) loads, and a constant current source. Circuit 43 amplifies the output signal of VCO 36 and determines a gain of RF buffer amplifier 42. An output of RF buffer amplifier 42 is an output of VCO circuit 32.

Peak amplitude detector 44 detects a peak amplitude of the VCO circuit output signal and generates an automatic level control (ALC) signal. RF amplifier 48 comprises an amplifier circuit 49 including parallel resistive-inductive-capacitive (RLC) loads with variable output resistors, $R_0$(ALC), and a variable current source, IBIAS(ALC). In the example of FIG. 4, the variable output resistors in the parallel loads and the current source are varied as a function of the ALC signal. As one example, different resistor and current values may be achieved by switching resistors in and out of a resistor network. The gain of RF amplifier 48 is controlled by using the ALC signal to change the variable current source of RF amplifier 48, change the output resistance of RF amplifier 48, or both, to compensate for process, temperature or age variations indicated by the output of RF amplifier 42. With this approach, an output of RF amplifier 48 is not subject to wide performance variations due to the gain controlling ALC signal generated from the constant output of VCO 36 and varying output of RF amplifier 42.

Figure 5:
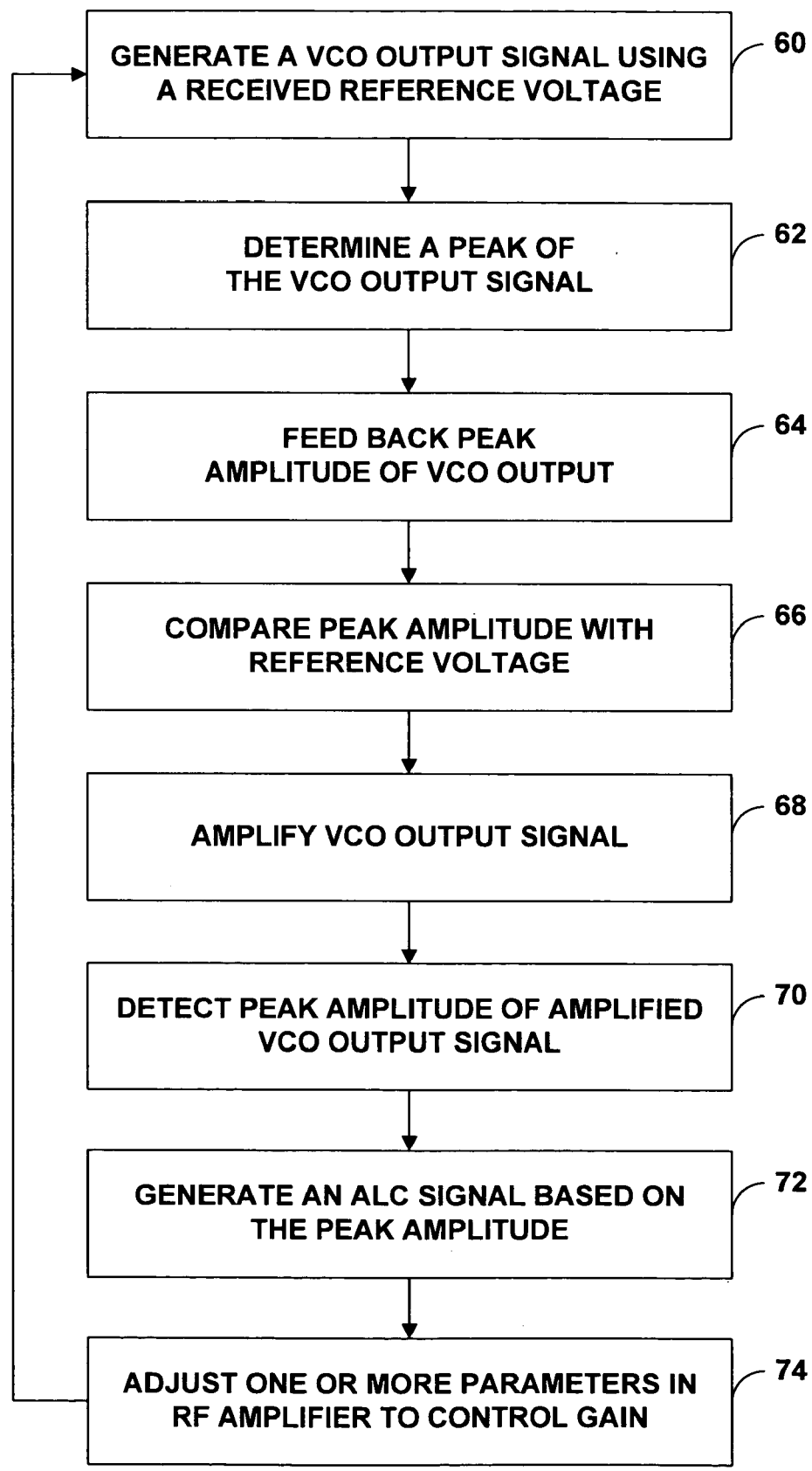
FIG. 5 is a flow diagram illustrating exemplary operation of an RF amplifier circuit performing automatic level control.

FIG. 5 is a flow diagram illustrating exemplary operation of an RF amplifier circuit, such as RF amplifier circuit 30 of FIG. 2, performing automatic level control. VCO 36 receives a reference voltage, such as a voltage provided by a crystal oscillator or an external source, and generates an output using the received reference voltage (60). Peak amplitude detector 38 detects a peak amplitude of the output of VCO 36 (62). Peak amplitude detector 38 feeds the peak amplitude output back into VCO 36 (64) and VCO 36 compares the peak amplitude output to reference voltage (66). VCO 36 may, for example, compare the signals using a comparator included within VCO 36. The comparison allows the amplitude of the output signal of VCO 36 to be controlled to maintain a substantially constant level.

RF buffer amplifier 42 receives the constant amplitude output signal from VCO 36 and amplifies the signal (68). Due to the constant amplitude input, the amplitude of the output of RF buffer amplifier 42 indicates the gain of the RF buffer amplifier, which in turn provides an indication of the gain of RF amplifier 48 due to the similarities between RF buffer amplifier 42 and RF amplifier 48 described in detail above.

Peak amplitude detector 44 detects a peak amplitude of the output signal of RF buffer amplifier 42 (70). Peak amplitude detector 44 generates the ALC signal based on the peak amplitude of the output signal of RF buffer amplifier 42 (72). Peak amplitude detector 44 may, for example, include an analog-to-digital converter that generates a digital ALC signal, such as a 4-bit digital word, from the analog output signal of RF buffer amplifier 42.

RF amplifier 48 receives an input signal voltage along with the ALC signal generated by peak amplitude detector 44, and adjusts various parameters within RF amplifier 48 to control the gain of RF amplifier 48 (74). RF amplifier 48 may, for example, include digital control switches that respond to the digital ALC signal to adjust various parameters within RF amplifier 48. For instance, the gain of RF amplifier 48 can be controlled by using the ALC signal to change a tail current of RF amplifier 48, change a transconductance of input transistors in RF amplifier 48, or change an output impedance of RF amplifier 48. RF amplifier 48 has a substantially constant gain due to the gain control by the ALC signal in RF amplifier 48. In the example of FIG. 4, the ALC signal is used to adjust variable resistances $R_0$(ALC) in the parallel RLC loads, and variable current source IBIAS (ALC). The constant gain compensates for process and temperature variations that occur in GHz range communication circuits without signal control circuitry.

Figure 6:
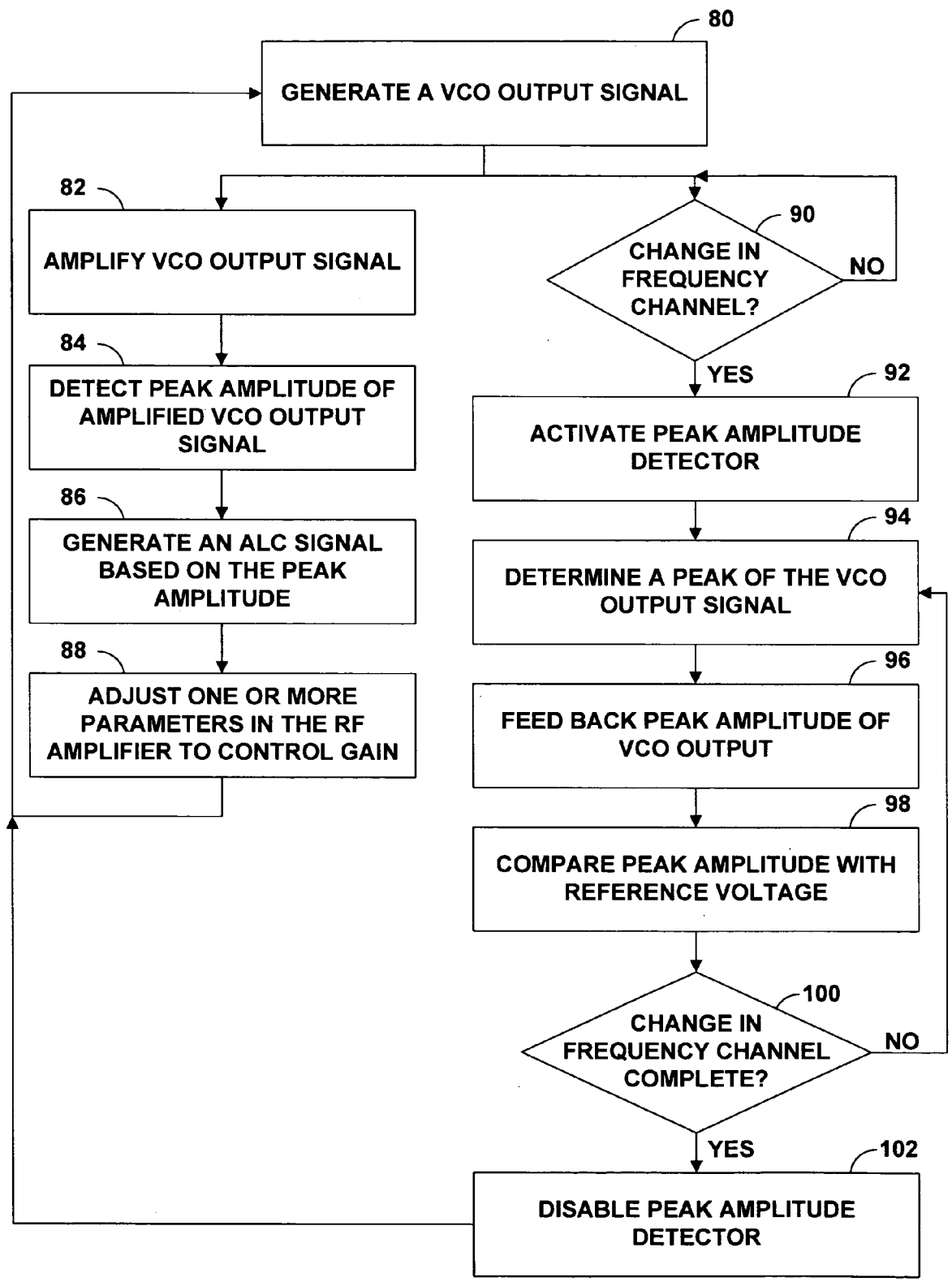
FIG. 6 is a flow diagram illustrating exemplary operation of an RF amplifier circuit performing automatic level control in which peak amplitude detection and feedback is only performed during a change in a frequency channel of a received or transmitted signal.

FIG. 6 is a flow diagram illustrating exemplary operation of an RF amplifier circuit, such as RF amplifier circuit 30 of FIG. 2, performing automatic level control in which peak amplitude detection and feedback of the VCO output is only performed during a change in a frequency channel of a received or transmitted signal. VCO 36 receives a reference voltage, such as a voltage provided by a crystal oscillator or an external source, and generates an output using the received reference voltage (80).

RF buffer amplifier 42 receives the constant amplitude output signal from VCO 36 and amplifies the signal (82). Peak amplitude detector 44 detects a peak amplitude of the output signal of RF buffer amplifier 42 (84). Peak amplitude detector 44 generates the ALC signal based on the peak amplitude of the output signal of RF buffer amplifier 42 (86). Peak amplitude detector 44 may, for example, include an analog-to-digital converter that generates a digital ALC signal from the analog output signal of RF buffer amplifier 42.

RF amplifier 48 receives an input signal voltage along with the ALC signal generated by peak amplitude detector 44, and adjusts various parameters within RF amplifier 48 to control the gain of RF amplifier 48 as described in detail above (88). RF amplifier 48 has a substantially constant gain due to the gain control by the ALC signal in RF amplifier 48 and, thus compensates for process and temperature variations that occur in GHz range communication circuits without signal control circuitry.

Controller 40 determines whether there is a change in a frequency channel of a received or transmitted signal (90). When controller 40 determines that there is a frequency channel change, controller 40 activates peak amplitude detector 38 (92). Peak amplitude detector 38 detects a peak amplitude of the output of VCO 36 (94). Peak amplitude detector 38 feeds the peak amplitude output back into VCO 36 (96) and VCO 36 compares the peak amplitude output to reference voltage (98). VCO 36 may, for example, compare the signals using a comparator included within VCO 36. The comparison allows the amplitude of the output signal of VCO 36 to be controlled to maintain a substantially constant level during the frequency change.

Controller 40 determines whether the change in frequency channel is complete (100). If the change in frequency channel is not complete, the peak detection feedback loop continues to monitor the peak amplitude of the VCO output and compare the amplitude with the reference voltage to maintain a substantially constant level during the frequency change. If the change in the frequency channel is complete, controller 40 disables the comparison feedback loop (102) until the next frequency change. The VCO 36 output signal is only subject to variation during the change in a frequency channel. Deactivating peak amplitude detector 38 following the change in the frequency channel reduces power usage in the VCO circuit 32 and eliminates any phase disruption that might occur due to a continually running a comparison feedback loop.

Figure 7:
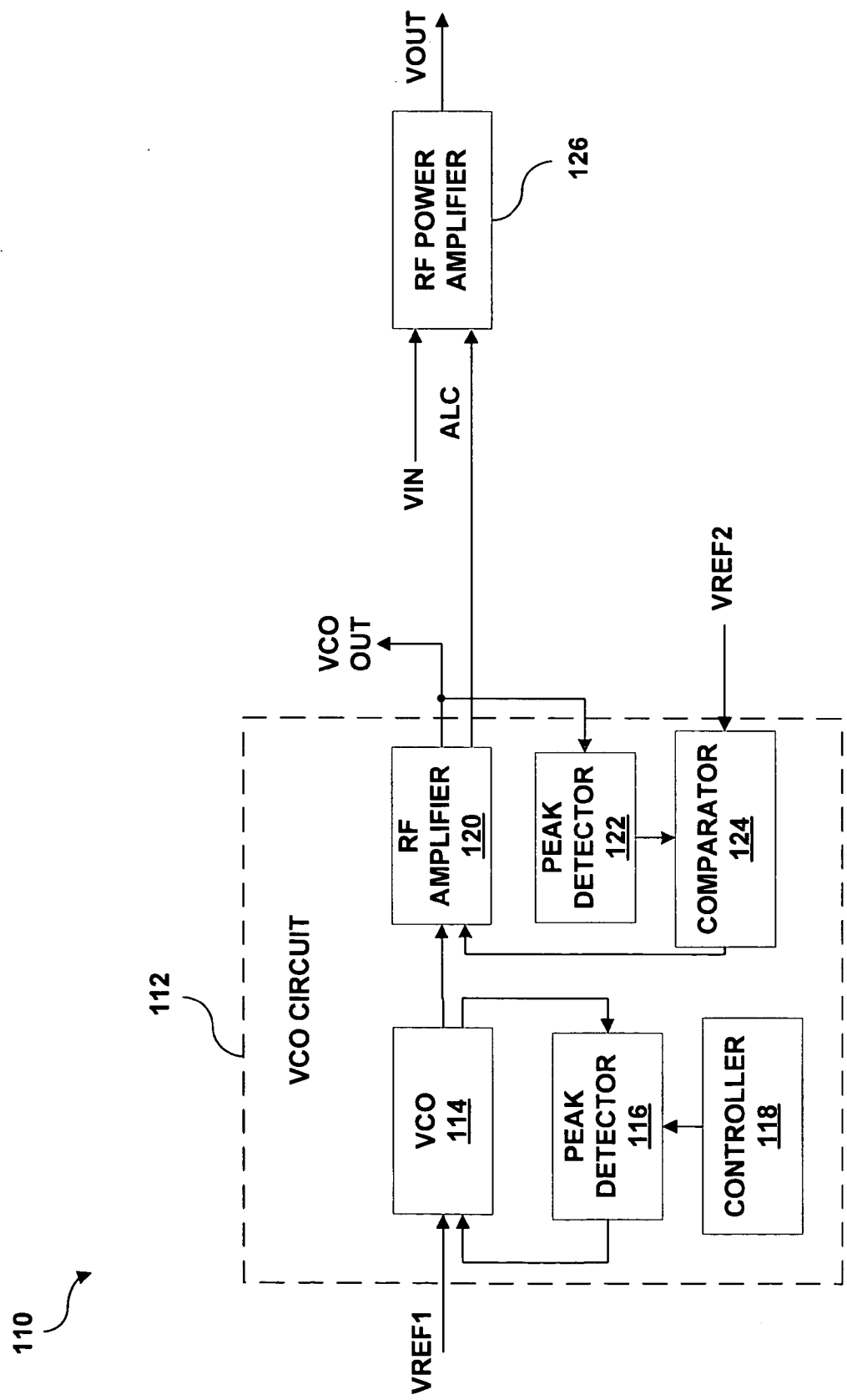
FIG. 7 is a block diagram illustrating another exemplary RF amplifier circuit.

FIG. 7 is a block diagram illustrating another embodiment of an RF amplifier circuit 110 that provides automatic level control in accordance with the invention. RF amplifier circuit 110 includes a voltage controlled oscillator (VCO) circuit 112 and a first RF amplifier 126. VCO circuit 112 includes a voltage controlled oscillator (VCO) 114, a first peak amplitude detector 116, a controller 118, a second peak detector 122, a comparator 124 and a second RF amplifier, i.e., RF buffer amplifier 120. VCO circuit 112 generates a VCO circuit output signal (VCO OUT) at the output of RF buffer amplifier 120. Additionally, VCO circuit 112 generates an ALC input signal for RF amplifier 126. In particular, peak amplitude detector 122 receives the VCO OUT signal from RF buffer amplifier 120 and generates a measure of the peak amplitude of the VCO OUT signal. Comparator 124 compares the peak amplitude output with a reference voltage VREF2, and feeds back the difference to RF buffer amplifier 120 to adjust its control bias. RF buffer amplifier 120 generates the ALC input signal for RF amplifier 126 based on its control bias. The ALC signal may, for example, be proportionate to the change in control bias made based on the comparison. The ALC signal allows RF amplifier 126 to predictably control signal gain as a function of process and temperature variations.

In particular, due to structural similarities between RF amplifier 126 and RF buffer amplifier 120 in VCO circuit 112, the gain of RF amplifier 126 can be controlled as a function of the control bias of RF buffer amplifier 120. VCO 114 provides a substantially constant input to RF buffer amplifier 120. Using the feedback loop through peak amplitude detector 122 and comparator 124, the output of RF buffer amplifier 120 is also forced to be constant by adjusting its control bias. Consequently, any control bias variation in buffer amplifier 120, given the substantially constant input and output, provides a direct indication of gain variation in the buffer amplifier 120.

Hence, due to the similarity between the buffer amplifier 120 in the VCO circuit 112 and the RF amplifier 126, the gain variation indicated by the buffer amplifier 120 serves as an approximate indication of the gain variation in the RF amplifier itself. By adjusting the gain with the ALC input to the RF amplifier 126 based on the control bias of the buffer amplifier 120 in the VCO circuit 126, a more stable gain can be achieved in the RF amplifier 126.

Circuit 110 may be applied in a wireless communication device, such as wireless communication device 10 of FIG. 2. For example, RF amplifier 126 may be either a transmitter amplifier (PA) 16 or a receiver amplifier (LNA) 22 (FIG. 2). In addition, VCO circuit 112 may be included within PLL 28 (FIG. 2). Modern wireless communication devices may use inductor-based RF amplifiers 120, 126 with components formed on a Metal layer of a wireless communication circuit. High frequency operations, e.g., in the GHz range, can cause wide variations in the performance of the Metal layer, and therefore, in the performance of inductor-based RF amplifiers 120, 126. The variations can be compensated by using a substantially constant VCO input signal for RF buffer amplifier 120 and generating the ALC input signal for RF amplifier 126 as a function of the control bias of RF buffer amplifier 120.

As shown in FIG. 7, VCO 114 receives a reference voltage (VREF1), such as a voltage provided by a stable source, such as a crystal oscillator or other external source. Peak amplitude detector 116 detects the peak amplitude of an output of VCO 114. The peak amplitude output is fed back into VCO 114 and compared to VREF1 by a comparator (not shown) included in VCO 114. The comparison allows the amplitude of the output signal of VCO 114 to be controlled to maintain a substantially constant level. The constant amplitude output signal from VCO 114 is input to RF buffer amplifier 120 and amplified. RF buffer amplifier 120 outputs VCO OUT, which is an amplification of the constant amplitude output signal from VCO 114. Peak amplitude detector 122 detects the peak amplitude of the output of RF buffer amplifier 120. Comparator 124 compares the peak amplitude to VREF2 and creates a measure of difference, and then passes the comparison result to RF buffer amplifier 120 to adjust its control bias. The feedback loop allows the amplitude of the output signal of RF buffer amplifier to be controlled to maintain a substantially constant level as well. Due to the constant amplitude input and output, the control bias of RF buffer amplifier 120 (VCO OUT) indicates the gain of the RF buffer amplifier, which in turn provides an indication of the gain of RF amplifier 126. The amplified output signal of RF buffer amplifier 120 is the output (VCO OUT) of VCO circuit 112.

In some embodiments, the peak amplitude detection of peak amplitude detector 116 and the comparison performed in VCO 114 may only be performed for a change in a frequency channel of a received or transmitted signal amplified by RF amplifier 126, rather than on a continuous basis. During the frequency channel change, controller 118 activates peak amplitude detector 116 to allow the signal comparison to occur. Once the change in the frequency channel is complete, controller 118 deactivates peak amplitude detector 116 and disables the comparison feedback loop. Thus, the constant VCO 114 output signal is only subject to variation during the change in a frequency channel. Deactivating peak amplitude detector 116 following the change in the frequency channel reduces power usage in the VCO circuit 112 and eliminates any phase disruption that might occur due to a continually running comparison feedback loop.

Peak amplitude detector 122 and comparator 124 create a feedback loop to control RF buffer amplifier 120 to generate the output signal (VCO OUT) with a substantially constant amplitude. RF buffer amplifier 120 generates the ALC signal based on its control bias. The ALC signal may be, for example, a 4-bit digital word. In that case, an analog-to-digital converter is used after RF buffer amplifier 120 to create the digital ALC signal from the analog ALC signal. Thus, RF buffer amplifier 120 outputs both an ALC signal to control the gain of RF amplifier 126 as well as a VCO OUT signal for use by other circuitry.

RF amplifier 126 receives an input signal voltage (VIN) along with the ALC signal generated by RF buffer amplifier 120. In embodiments in which the ALC signal is a digital control word, RF amplifier 126 includes a digital controller to adjust the gain of the RF amplifier 126 in response to the digital ALC control word. For example, RF amplifier 126 may include a digital controller in the form of digital control switches (not shown) that respond to the digital ALC signal to adjust various parameters within RF amplifier 126. For example, the gain of RF amplifier 126 can be controlled by using the ALC signal to change a tail current of RF amplifier 126, change a transconductance of input transistors in RF amplifier 126, or change an output impedance of RF amplifier 126. There are also other ways to control the gain with the ALC bits, such as controlling digital switches to redirect portions of the output current from RF amplifier 126 or change the source degenerating resistors, e.g., via a resistor network.

RF amplifier 126 has a substantially constant gain due to the gain control by the ALC signal in RF amplifier 126. The constant gain compensates for process and temperature variations that occur in GHz range communication circuits without signal control circuitry.

Figure 8:
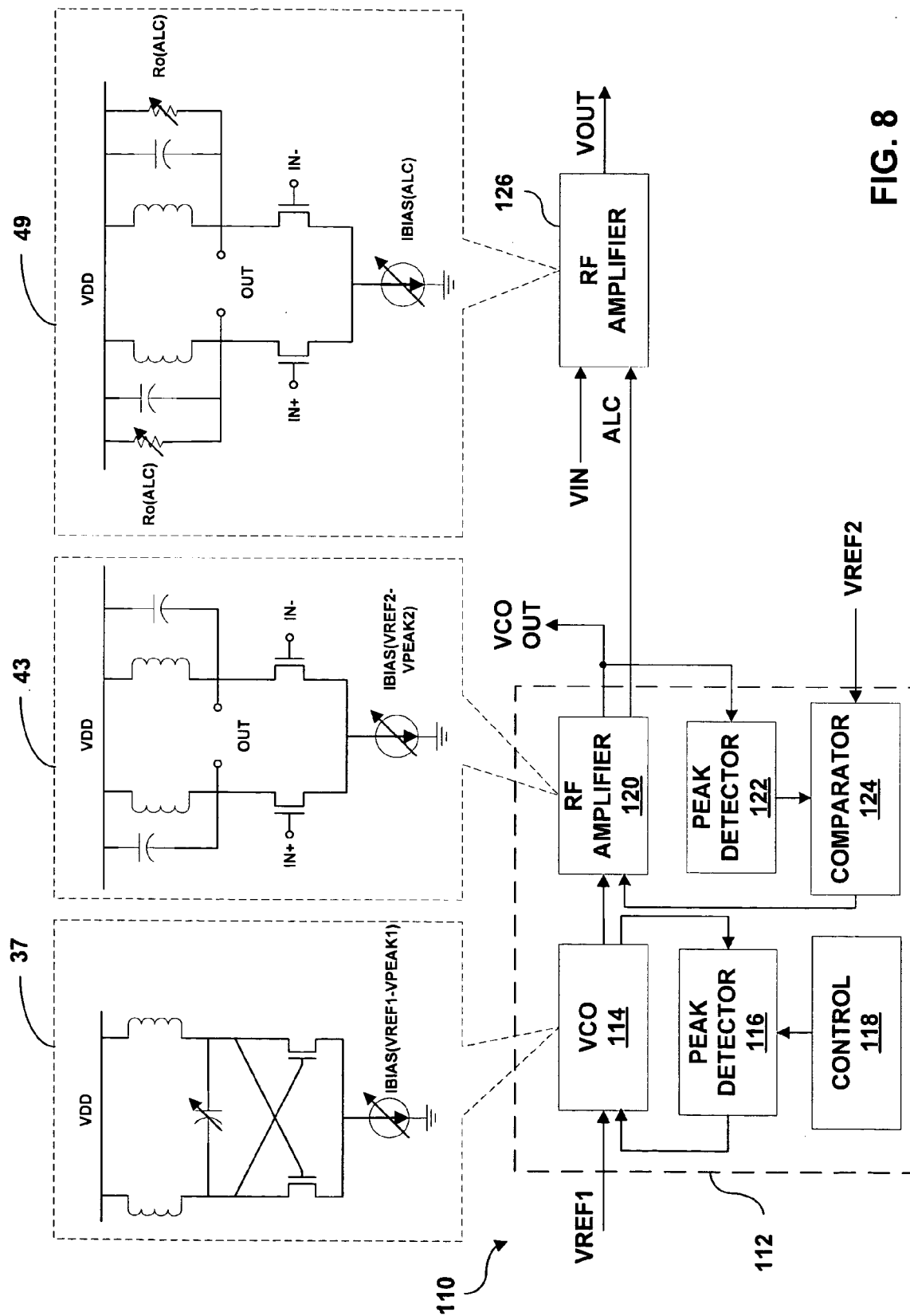
FIG. 8 is a block diagram illustrating the RF amplifier circuit of FIG. 7 in further detail.

FIG. 8 is a block diagram illustrating an embodiment of an RF amplifier circuit 110 in further detail. Circuit 110 operates as described in reference to FIG. 7 and again includes a voltage controlled oscillator (VCO) circuit 112, and an RF amplifier 126. VCO circuit 112 includes a voltage controlled oscillator (VCO) 114, a peak amplitude detector 116, a control 118, an RF buffer amplifier 120, a peak amplitude detector 122 and a comparator 124. VCO circuit 112 generates a VCO circuit output signal (VCO OUT). As shown in FIG. 8, RF buffer amplifier 120, and RF amplifier 126 comprise similar circuits including inductive loads. The illustrated circuits describe one way to build RF amplifier circuit 110; many other circuit designs, however, could be used to realize a similar function.

VCO 114 comprises an oscillator circuit 37 including inductive loads, a variable capacitor, and a variable current source. The current source, IBIAS (VREF1–VPEAK1), depends on the difference between a reference signal voltage (VREF1) and a peak voltage (VPEAK1) detected by peak amplitude detector 116. The variable current source allows an output of VCO 114 to be controlled to a substantially constant level. RF buffer amplifier 120 comprises an amplifier circuit 43 including inductive-capacitive (LC) loads, and a variable current source. The current source, IBIAS (VREF2–VPEAK2), depends on the difference between a reference signal voltage (VREF2) and a peak voltage (VPEAK2) detected by peak amplitude detector 122. The variable current source allows an output of RF buffer amplifier 114 to be controlled to a substantially constant level. Circuit 43 amplifies the output signal of VCO 114 and determines a gain of RF buffer amplifier 120. An output of RF buffer amplifier 120 is an output of VCO circuit 112.

RF buffer amplifier 120 generates an automatic level control (ALC) signal based on its control bias IBIAS (VREF2–VPEAK2). RF amplifier 126 comprises an amplifier circuit 49 including parallel resistive-inductive-capacitive (RLC) loads with variable output resistors, $R_O(ALC)$, and a variable current source, IBIAS(ALC). In the example of FIG. 8, the variable output resistors in the parallel loads and the current source are varied as a function of the ALC signal. As one example, different resistor and current values may be achieved by switching resistors in and out of a resistor network. The gain of RF amplifier 126 is controlled by using the ALC signal to change the variable current source of RF amplifier 126, change the output resistance of RF amplifier 126, or both, to compensate for process, temperature or age variations indicated by the control bias of RF amplifier 120. With this approach, an output of RF amplifier 126 is not subject to wide performance variations due to the gain controlling ALC signal generated from the constant output of VCO 114 and varying control bias of RF amplifier 120.

Figure 9:
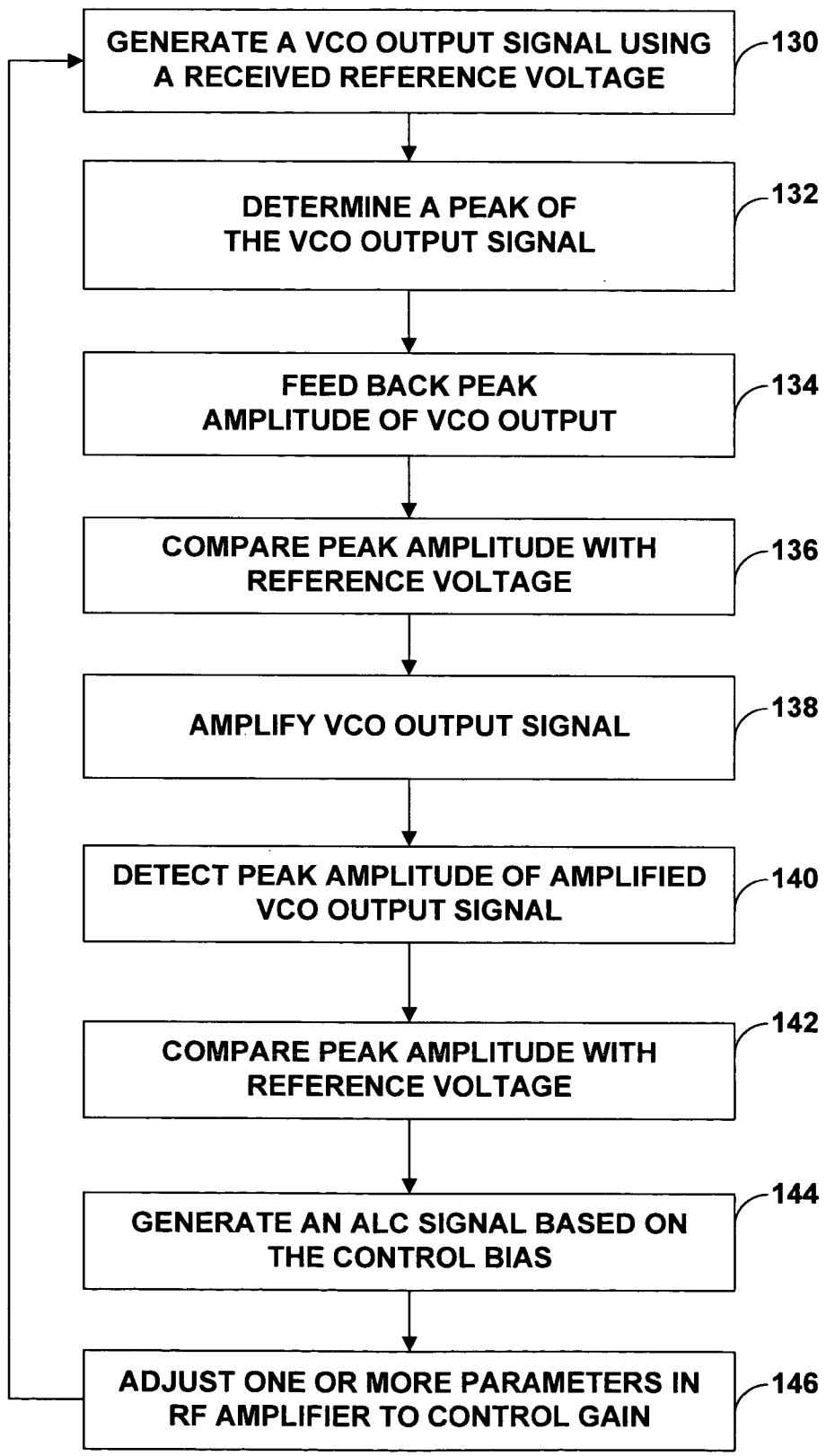
FIG. 9 is a flow diagram illustrating exemplary operation of the RF amplifier circuit of FIGS. 7 and 8 performing automatic level control.

FIG. 9 is a flow diagram illustrating exemplary operation of an RF amplifier circuit, such as RF amplifier circuit 110 of FIG. 2, performing automatic level control. VCO 114 receives a reference voltage, such as a voltage provided by a crystal oscillator or an external source, and generates an output using the received reference voltage (130). Peak amplitude detector 116 detects a peak amplitude of the output of VCO 114 (132). Peak amplitude detector 116 feeds the peak amplitude output back into VCO 114 (134) and VCO 114 compares the peak amplitude output to reference voltage (136). VCO 114 may, for example, compare the signals using a comparator included within VCO 114. The comparison allows the amplitude of the output signal of VCO 114 to be controlled to maintain a substantially constant level.

RF buffer amplifier 120 receives the constant amplitude output signal from VCO 114 and amplifies the signal (138). Peak amplitude detector 122 detects a peak amplitude of the output of RF buffer amplifier 120 (140). Peak amplitude detector 122 feeds the peak amplitude output back into comparator 124 (142) and comparator 124 compares the peak amplitude output to reference voltage. RF buffer amplifier 120 receives the comparison result to adjust its control bias and generates the ALC signal in addition to the VCO OUT signal (144). The comparison allows the amplitude of the output signal of RF buffer amplifier 120 to be controlled to maintain a substantially constant level. Due to the constant amplitude input and output, the control bias of RF buffer amplifier 120 indicates the gain of the RF buffer amplifier, which in turn provides an indication of the gain of RF amplifier 126 due to the similarities between RF buffer amplifier 120 and RF amplifier 126 described in detail above.

RF buffer amplifier 120 generates the ALC signal based on its control bias. Additionally, an analog-to-digital converter can be used after RF buffer amplifier to generate a digital ALC signal, such as a 4-bit digital word, from the analog ALC output of RF buffer amplifier 120.

RF amplifier 126 receives an input signal voltage along with the ALC signal generated by RF buffer amplifier 120, and adjusts various parameters within RF amplifier 126 to control the gain of RF amplifier 126 (146). RF amplifier 126 may, for example, include digital control switches that respond to the digital ALC signal to adjust various parameters within RF amplifier 126. For instance, the gain of RF amplifier 126 can be controlled by using the ALC signal to change a tail current of RF amplifier 126, change a transconductance of input transistors in RF amplifier 126, or change an output impedance of RF amplifier 126. RF amplifier 126 has a substantially constant gain due to the gain control by the ALC signal in RF amplifier 126. In the example of FIG. 8, the ALC signal is used to adjust variable resistances $R_O(ALC)$ in the parallel RLC loads, and variable current source IBIAS(ALC). The constant gain compensates for process and temperature variations that occur in GHz range communication circuits without signal control circuitry.

Figure 10:
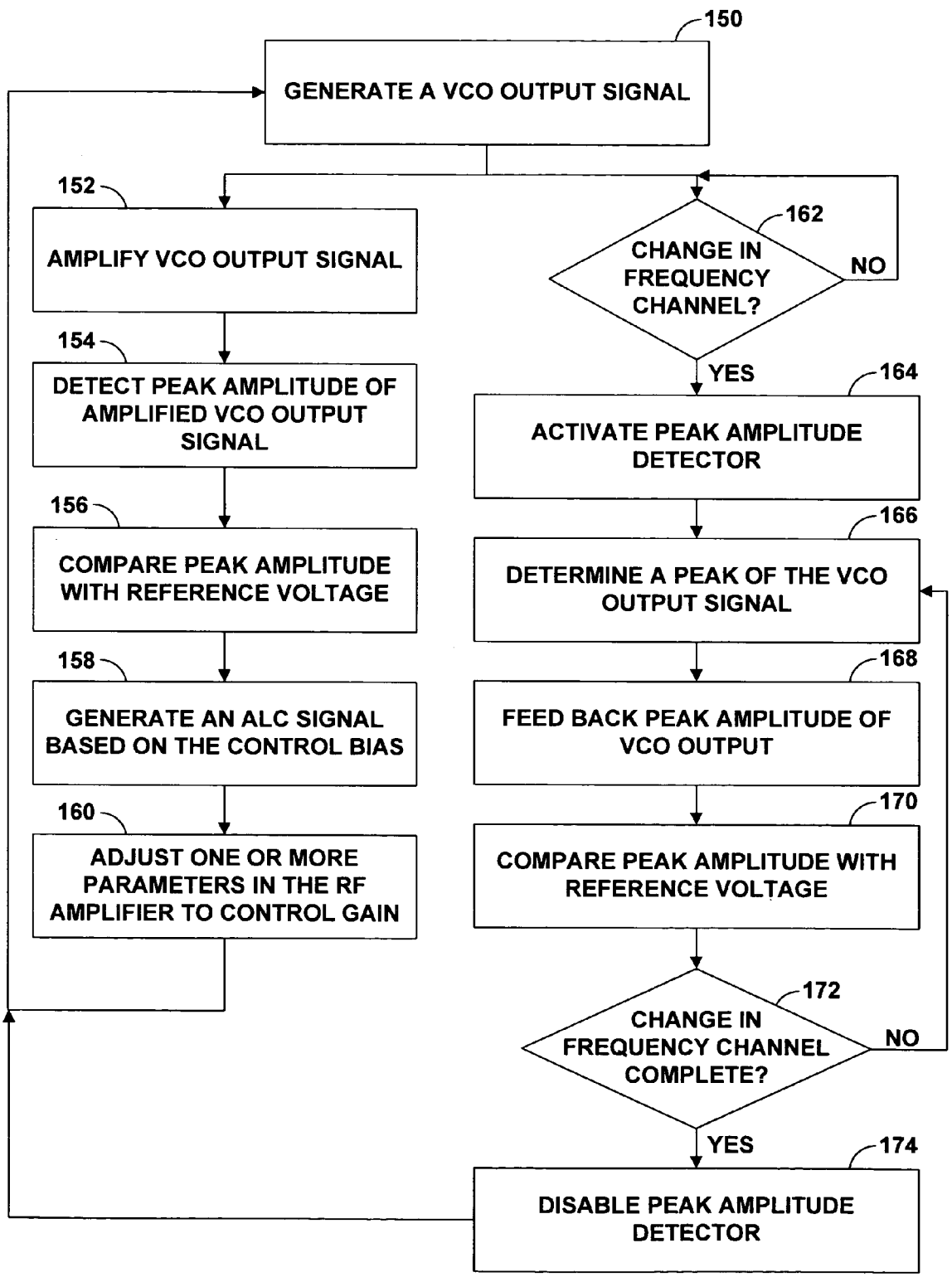
FIG. 10 is a flow diagram illustrating exemplary operation of the RF amplifier circuit of FIGS. 7 and 8 performing automatic level control in which peak amplitude detection and feedback is only performed during a change in a frequency channel of a received or transmitted signal.

FIG. 10 is a flow diagram illustrating exemplary operation of an RF amplifier circuit, such as RF amplifier circuit 110 of FIG. 2, performing automatic level control in which peak amplitude detection and feedback of the VCO output is only performed during a change in a frequency channel of a received or transmitted signal. VCO 114 receives a reference voltage, such as a voltage provided by a crystal oscillator or an external source, and generates an output using the received reference voltage (150).

RF buffer amplifier 120 receives the constant amplitude output signal from VCO 114 and amplifies the signal (152). Peak amplitude detector 122 detects a peak amplitude of the output signal of RF buffer amplifier 120 (154). Comparator 124 compares the peak amplitude output from peak amplitude detector 122 to a reference voltage (156). A comparison result is fed back to RF buffer amplifier to adjust its control bias, and an ALC signal is generated by RF buffer amplifier 120 based on its control bias (158). An analog-to-digital converter may be used to generate a digital ALC signal from the analog ALC output of RF buffer amplifier 120.

RF amplifier 126 receives an input signal voltage along with the ALC signal generated by RF buffer amplifier 120, and adjusts various parameters within RF amplifier 126 to control the gain of RF amplifier 126 as described in detail above (160). RF amplifier 126 has a substantially constant gain due to the gain control by the ALC signal in RF amplifier 126 and, thus compensates for process and temperature variations that occur in GHz range communication circuits without signal control circuitry.

Controller 118 determines whether there is a change in a frequency channel of a received or transmitted signal (162). When controller 118 determines that there is a frequency channel change, controller 118 activates peak amplitude detector 116 (164). Peak amplitude detector 116 detects a peak amplitude of the output of VCO 114 (166). Peak amplitude detector 116 feeds the peak amplitude output back into VCO 114 (168) and VCO 114 compares the peak amplitude output to reference voltage (170). VCO 114 may, for example, compare the signals using a comparator included within VCO 114. The comparison allows the amplitude of the output signal of VCO 114 to be controlled to maintain a substantially constant level during the frequency change.

Controller 118 determines whether the change in frequency channel is complete (172). If the change in frequency channel is not complete, the peak detection feedback loop continues to monitor the peak amplitude of the VCO output and compare the amplitude with the reference voltage to maintain a substantially constant level during the frequency change. If the change in the frequency channel is complete, controller 118 disables the comparison feedback loop and hold the AC signal (174) until the next frequency change. The VCO 114 output signal is only subject to variation during the change in a frequency channel. Deactivating peak amplitude detector 116 following the change in the frequency channel reduces power usage in the VCO circuit 112 and eliminates any phase disruption that might occur due to a continually running a comparison feedback loop.

Various embodiments of the invention have been described. These and other embodiments are within the scope of the following claims.

The invention claimed is:

1. A device comprising:
a voltage controlled oscillator (VCO) circuit;
a radio frequency (RF) amplifier with a gain controlled as a function of an output of the VCO circuit; and
a peak amplitude detector that detects a peak amplitude of the output of the VCO circuit and generates an automatic level control (ALC) signal to control the gain of the RF amplifier based on the peak amplitude of the output of the VCO circuit.

2. The device of claim 1, wherein the RF amplifier is one of a receiver amplifier and a transmitter amplifier.

3. A device comprising:
a voltage controlled oscillator (VCO) circuit;
a radio frequency (RF) amplifier with a gain controlled as a function of an output of the VCO circuit; and
a peak amplitude detector that detects a peak amplitude of the output of the VCO circuit and generates an automatic level control (ALC) signal to control the gain of the RF amplifier based on the peak amplitude of the output of the VCO circuit, wherein the RF amplifier controls parallel loads in the RF amplifier based on the ALC signal.

4. A device comprising:
a voltage controlled oscillator (VCO) circuit;
a radio frequency (RF) amplifier with a gain controlled as a function of an output of the VCO circuit; and
a peak amplitude detector that detects a peak amplitude of the output of the VCO circuit and generates an automatic level control (ALC) signal to control the gain of the RF amplifier based on the peak amplitude of the output of the VCO circuit, wherein the RF amplifier controls a bias current source in the RF amplifier based on the ALC signal.

5. A device comprising:
a voltage controlled oscillator (VCO) circuit;
a radio frequency (RF) amplifier with a gain controlled as a function of an output of the VCO circuit; and
a peak amplitude detector that detects a peak amplitude of the output of the VCO circuit and generates an automatic level control (ALC) signal to control the gain of the RF amplifier based on the peak amplitude of the output of the VCO circuit, wherein the peak amplitude detector comprises an analog to digital converter to generate a digital ALC signal, and the RF amplifier includes a digital controller to adjust the gain of the RF amplifier in response to the digital ALC signal.

6. The device of claim 5, wherein the digital ALC signal comprises a 4-bit digital word.

7. A device comprising:
a voltage controlled oscillator (VCO) circuit;
a radio frequency (RF) amplifier with a gain controlled as a function of an output of the VCO circuit; and
a peak amplitude detector that detects a peak amplitude of the output of the VCO circuit and generates an automatic level control (ALC) signal to control the gain of the RF amplifier based on the peak amplitude of the output of the VCO circuit, wherein the RF amplifier controls the gain in response to the ALC signal by changing a tail current of the RF amplifier, changing a transconductance of an input transistor in the RF amplifier, or changing an output impedance of the RF amplifier.

8. A device comprising:
a voltage controlled oscillator (VCO) circuit;
a radio frequency (RF) amplifier with a gain controlled as a function of an output of the VCO circuit; and
a peak amplitude detector that detects a peak amplitude of the output of the VCO circuit and generates an automatic level control (ALC) signal to control the gain of the RF amplifier based on the peak amplitude of the output of the VCO circuit, wherein the RF amplifier includes at least one variable resistor and the RF amplifier adjusts the variable resistor in response to the ALC signal.

9. The device of claim 1, wherein the RF amplifier is a first RF amplifier and the peak amplitude detector is a first peak amplitude detector, and the VCO circuit comprises:
- a voltage controlled oscillator (VCO) that generates a VCO output;
- a second peak amplitude detector that detects a peak amplitude of the VCO output;
- a comparator that compares the peak amplitude of the VCO output to a reference signal to control the VCO output; and
- a second RF amplifier that amplifies the VCO output to generate the output of the VCO circuit.

10. The device of claim 9, further comprising a controller to activate the second peak amplitude detector upon detecting a change in a frequency channel of a signal amplified by the first RF amplifier, and to deactivate the second peak amplitude detector following the change in the frequency channel.

* * * * *